United States Patent [19]

Kurd

[11] Patent Number: 6,043,717
[45] Date of Patent: Mar. 28, 2000

[54] SIGNAL SYNCHRONIZATION AND FREQUENCY SYNTHESIS SYSTEM CONFIGURABLE AS PLL OR DLL

[75] Inventor: Nasser A. Kurd, Hillsboro, Oreg.

[73] Assignee: Intel Corporation, Santa Clara, Calif.

[21] Appl. No.: 09/158,749

[22] Filed: Sep. 22, 1998

[51] Int. Cl.[7] .............................. H03L 7/099; G06F 1/04
[52] U.S. Cl. ................................ 331/17; 331/25; 331/34; 327/157; 327/158; 327/161
[58] Field of Search .................................. 331/17, 25, 34; 327/156, 157, 158, 161

[56] References Cited

U.S. PATENT DOCUMENTS

| | | | |
|---|---|---|---|
| 5,317,202 | 5/1994 | Waizman | 307/269 |
| 5,446,867 | 8/1995 | Young et al. | 395/550 |
| 5,537,069 | 7/1996 | Volk | 327/149 |
| 5,907,253 | 5/1999 | Davis et al. | 327/156 |
| 5,926,053 | 7/1999 | McDermott et al. | 327/298 |

*Primary Examiner*—Siegfried H. Grimm
*Attorney, Agent, or Firm*—Blakely, Sokoloff, Taylor & Zafman LLP

[57] ABSTRACT

A circuit including a configurable mode device configured to generate an output signal in response to a differential control signal, the differential control signal representing a phase difference between at least two signals. Additionally, a state machine configured to generate a control signal in response to a mode selection signal, wherein the control signal configures the configurable mode device to operate in either a delay lock loop mode or a phase lock loop mode.

31 Claims, 7 Drawing Sheets

SIGNAL SYNCHRONIZATION AND FREQUENCY SYNTHESIS SYSTEM CONFIGURABLE AS PLL OR DLL

FIELD OF THE INVENTION

The present invention relates to the field of signal synchronizing and frequency synthesis circuits for sequence control of integrated circuit logic. More specifically, the present invention relates to signal synchronizing and frequency synthesis circuits of the phase locked loop and delay locked loop type.

BACKGROUND

Generally, signal synchronizing and frequency synthesis circuitry (SSFSC), such as Phase Lock Loops (PLLs) and Delay Lock Loops (DLLs), are used in maintaining the synchronous operation of microprocessor systems. In integrated circuit (IC) logic, signal synchronizing and synthesis circuitry, such as PLLs and DLLs, are utilized in order to minimize timing delays or errors. Accordingly, such signal synchronizing and synthesis circuitry allows for the synchronization of multiple signals to conform to a desired target frequency signal. The synchronization of multiple operating signals allows multiple circuits within a system to operate in accordance with a desired timing protocol. In such applications as computer systems, the various components of the microprocessor system require synchronous operation in order to perform in accordance with a desired operating protocol standard.

Generally, synchronizing or timing problems occur when various clock signals operating within the system lose phase alignment or become skewed while passing through intermediate circuitry having variant propagation delays. In a high-speed multiple chip computer system, it is particularly important to maintain the phase difference between clock signals at different sections of the system to a specified minimum value. Nevertheless, variations in propagation can be caused by circuitry structure variables or tolerance variables associated with the manufacturing process. Another synchronizing or timing problem may occur with respect to typical microprocessor systems that have an external clock signal (XCLK) and another internal clock signal (CLKIN) which is internal to the microprocessor core. These two clock signals may sometimes become skewed (out of phase) with relation to each other, as between the clock signal internal to the microprocessor core and inputs generated by a clock signal external to the microprocessor core.

Typically, the synchronous operation of a microprocessor system, along with the various logic components and sub-systems therein, is accomplished through the use of one or more clock signals. Each component within the system utilizes a clock signal for synchronizing the operation of its own internal sequential logic circuitry to that of the system in order to provide operation in accordance with the desired operating protocol standard. Therefore, in high-speed systems, the synchronous operation of clock signals with respect to each of the clocked components must be maintained with high efficiency or else multiple system timing errors and delays can result. Two well-known systems utilized in maintaining the synchronous operation of microprocessor systems are the phase lock loop (PLL) and the delay lock loop (DLL).

The DLL is a type of feedback control system that attempts to maintain a constant or zero phase difference between the clock signals at different sections within the system. The conventional DLL 100, as shown in FIG. 1A, is comprised of a phase detector 102, a counter 104, a multiplexer 106, and a delay line element 108, which are interconnected to form a feedback DLL system. The DLL 100, in operation, receives a reference signal (REFCLK) at both the phase detector 102 and the delay line element 108. The delay line element 108 generates duplicate signals of the reference signal (REFCLK-N) called taps 110, each of the taps 110 are delayed by a selected time period and output to the multiplexer 106. The counter 104 receives the output from the phase detector 102 and selects which tap output 110 from the delay line element 108 will be propagated to the multiplexer output (CLKOUT). The multiplexer output (CLKOUT) is then looped back via a feedback line to the phase detector 102, wherein the phase detector 102 generates a phase error value which is supplied to the counter 104. Based upon the phase error value, the counter 104 generates a signal to correct the phase error, counting upwards when the (CLKOUT) leads (REFCLK), or counting downwards when the (CLKOUT) lags (REFCLK). Based on the counter value, the timing of the multiplexer output is either advanced or delayed until the (CLKOUT) signal is in phase or coincident with the phase of the (REFCLK) signal.

Likewise, the PLL is a type of feedback control system that attempts to maintain a constant or zero phase difference between the two signals (REFCLK and FB) in order to prevent timing errors which can lead to delays in microprocessor operation. The conventional PLL 120, as shown in Figure 1B, includes a phase detector 122, charge pump 124, loop filter 126, a voltage controlled oscillator (VCO) 128, a clock distribution tree 130, and a frequency divider device 132 which are interconnected to form a feedback PLL system.

In operation, the phase detector 122 receives an input signal (REFCLK) and a feedback signal (FB), the feedback signal (FB) being the CLKOUT signal from the VCO 128 which has been passed through the clock distribution tree 130 and the divider device 132. The phase detector 122 compares the input signal (REF) and the feedback signal (FB) in order to determine if there is any phase difference between the two signals. If a phase difference is detected, the phase detector 122 generates either an UP or DN signal in order to pump a control voltage (VCNTL) higher or lower. For example, if the REFCLK signal leads the FB signal, then the phase detector 122 would activate the UP signal a specific amount corresponding to the phase difference. Alternately, if the FB signal leads the REFCLK signal, then the phase detector 122 would activate the DN signal a specific amount corresponding to the phase difference. If the input signal (REFCLK) and the feedback signal (FB) are locked or in-phase, then neither the UP or DN signals are activated.

The charge pump 124 then converts the digital state (UP/DN) of the phase detector 122 into an analog control voltage (VCNTL) which is used to operate and control the voltage controlled oscillator (VCO) 128. The control voltage signal (VCNTL) is then applied to the VCO 128 which varies the set frequency of the VCO 128 in a direction which reduces the frequency difference or phase error between the input signal (REF) and the feedback signal (FB). The signal is then supplied to the clock distribution tree 130 and then to the frequency divider device 132, before being applied back to the phase detector 122. The process is repeated until the REF and FB signals become synchronized and the lock state is achieved.

Generally, a typical microprocessor requires a PLL, a DLL, or both in order to address the various synchronization and frequency synthesis problems that arise in connection with typical microprocessor operations. Accordingly, a question arises on whether to use a PLL or a DLL for frequency synthesis and synchronization. The stability and jitter of a PLL, as compared to a DLL, where it can be used for frequency synthesis, has typically maintained a better jitter performance since the jitter accumulated by the end of the line does not contribute to the next clock cycles.

The conventional or currently available PLL and the DLL circuits, however, each require their own respective circuitry to perform their respective operative tasks. Accordingly, the requirement of having two separate and unique circuits (PLL and DLL) to address the different synchronization and frequency synthesis problems which arise with respect to typical microprocessor operations, necessarily increases the amount of space needed to support these circuits. Moreover, the requirement of the two separate circuits also increases the complexity of the system as different signals need to be switched and routed to different circuitry depending on the timing problems encountered. Additionally, having two separate and unique circuits (PLL and DLL) to address the different synchronization problems necessarily increases the overall cost of the microprocessor system.

It is therefore desirable to provide a single circuit that provides the configurable operation of both a PLL and a DLL to a microprocessor without utilizing the amount of space which is typically used in separate PLLs and DLLs. Moreover, it would be desirable to provide a single circuit that provides the operation of both the PLL and the DLL without increasing the complexity and cost of the system.

SUMMARY OF THE INVENTION

A circuit comprising a configurable mode device configured to generate an output signal using a differential signal, the differential signal representing a phase difference between at least two signals. Additionally, a state machine is provided, wherein the state machine is configured to generate a control signal in response to a mode selection signal, the control signal configuring the configurable mode device to operate in either a delay lock loop mode or a phase lock loop mode.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DETAILED DESCRIPTION

The following detailed description sets forth numerous specific details to provide a thorough understanding of the invention. However, those of ordinary skill in the art will appreciate that the invention may be practiced without these specific details. In other instances, well-known methods, procedures, protocols, components, algorithms, and circuits have not been described in detail so as not to obscure the invention.

Figure 1A:
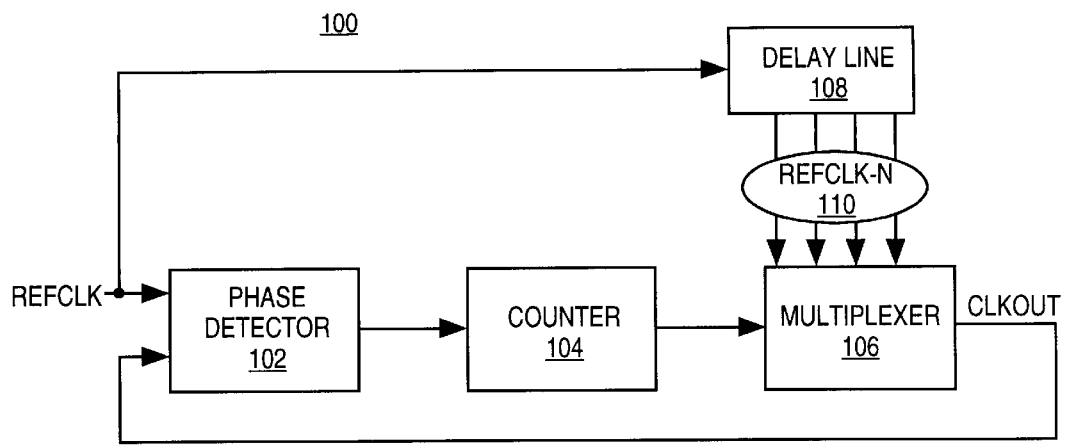
FIG. 1A illustrates a conventional/prior art delay lock loop (DLL).
Figure 1B:
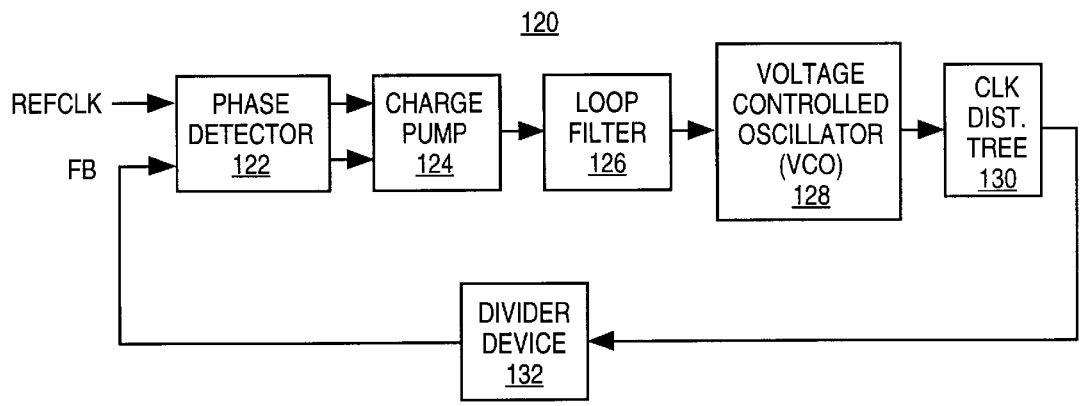
FIG. 1B illustrates a conventional/prior art phase lock loop (PLL).
Figure 2:
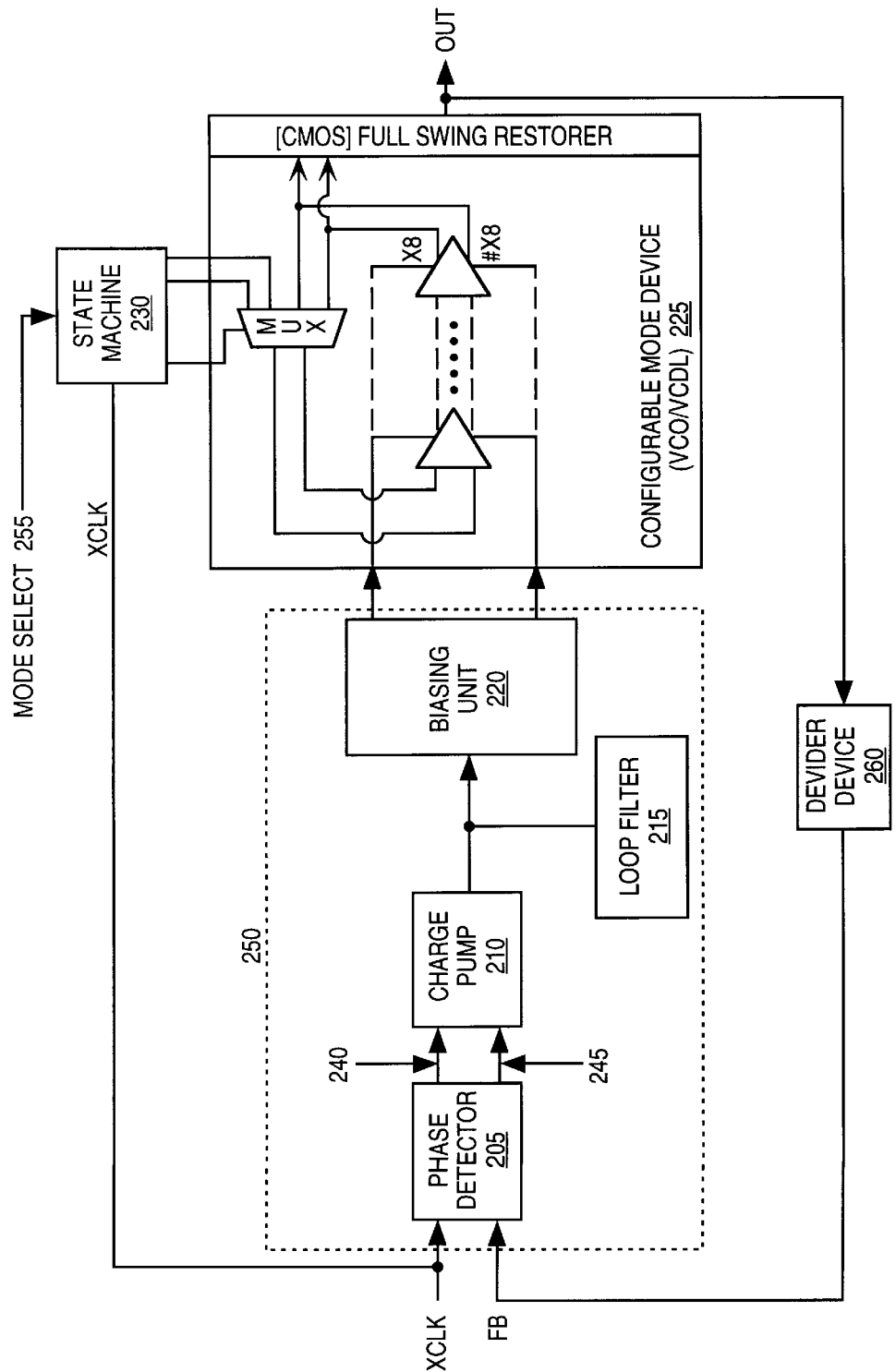
FIG. 2 illustrates an embodiment of the present invention in a block diagram format.

Embodiments of the present invention provide a synchronization/frequency synthesis system 200 (hereinafter, System 200) capable of operating as both a phase lock loop (PLL) and/or a delay lock loop (DLL). These embodiments, such as the embodiment shown in FIG. 2, are capable of being operated in a PLL mode or in a DLL mode in order to address the various synchronization and frequency synthesis (multiplication) problems which arise in connection with typical microprocessor operations. For instance, both the PLL and the DLL are used to synthesize frequency, as well as to synchronize (deskew) out of phase signals, for use in microprocessor operations. The present invention, however, is not limited to microprocessor systems as the inventive aspects disclosed herein could equally be applied to any system in order to address any synchronization or frequency synthesis (multiplication) problems associated with any type of circuit.

FIG. 2 illustrates one embodiment of the System 200 having a phase detector 205, charge pump 210, loop filter 215, biasing unit 220, configurable mode device 225, state machine 230, and a divider device 260 which are operatively coupled together to form the System 200. The phase detector 205 is shown having two inputs that receive a system reference signal or external clock signal (XCLK) and a feedback or target signal (FB). The XCLK signal is a reference clock from outside of the chip. The FB signal is the feedback signal from the output (OUT) of the System 200 which is carried to the phase detector 205 by a feedback loop after the passing through a clock distribution tree (not shown) and the divider device 260.

In operation, the phase detector 205 receives both signals, XCLK and FB, and determines if a phase difference exists between the two signals. If a phase difference is detected, the phase detector 205 generates either an UP (UP) or DOWN (DN) digital state signal which is proportionate to the magnitude of the detected phase error between the signals. If there is no phase error, both the UP and DN signals are high for a small time, which does not effect the value of the control voltage (VCNTL), as the UP and DN signals effectively cancel each other. If a phase error is detected between the signals, the phase detector 205 generates either an UP or DN digital state signal depending upon the phase relation associated with the detected phase error.

For instance, if the XCLK signal leads the FB signal, then the phase detector 205 generates an UP signal which is supplied to the charge pump 210 through an UP signal line 240. Conversely, if the FB signal leads the XCLK signal, then the phase detector 205 generates a DN signal which is supplied to the charge pump 210 through a DN signal line 245. If the XCLK signal and the FB signal are in phase or locked, both the UP and DN are high for a small time, which does not effect the value of the control voltage (VCNTL), as the UP and DN signals effectively cancel each other.

The charge pump 210, which is coupled between the phase detector 205 and the loop filter 215, receives and converts the digital states (UP/DN) from the phase detector 205 into an analog value, which either charges or discharges the loop filter 215. For instance, if the charge pump 210 receives an UP signal from the phase detector 205, the charge pump 210 charges the loop filter 215, based on the width of the UP signal, which proportionately increases the value of the control voltage (VCNTL). Conversely, if the charge pump 210 receives a DN signal from the phase detector 205, the charge pump 210 discharges the loop filter 215, based on the width of the DN signal, which proportionately decreases the value of VCNTL. In a locked system status where there is no measurable phase error, the charge pump 210 can be configured to maintain the current level of VCNTL at a relatively steady value. Therefore, the phase difference detected in the phase detector 205 corresponds proportionately to the value of VCNTL as the respective UP/DN signals are processed via the charge pump 210. Additionally, the loop filter 215 provides stability in loop operation and minimizes jitter in the system.

The loop filter 215, which is coupled to the charge pump 210, partially defines the loop operating characteristics of the System 200. The loop filter 215, which may constitute a capacitor in first order systems, or a capacitor/resistor combination in second order systems, is utilized in combination with a supply voltage Vcc (not shown), to assist in maintaining the stability of the entire System 200. Additionally, the loop filter 215 can be used in controlling the lock time and overshooting/undershooting of the desired target frequency.

The biasing device 220 is coupled to the loop filter 215 and receives the VCNTL signal, the biasing device 220 converts the VCNTL signal into an n-bias signal and p-bias signal, corresponding to the value of VCNTL. In one embodiment, the biasing device 220 may comprise a replica feedback device comprised of half buffer replicas. The bias signals, p-bias and n-bias, are input into the configurable mode device (CMD) 225 which is coupled to the biasing device 220. Accordingly, the p-bias and n-bias signals correspond proportionately to the phase difference detected in the phase detector 205 which is reflected in the VCNTL signal. The phase detector 205, charge pump 210, loop filter 215, and biasing device 220 collectively constitute a loop control or phase circuit 250 which is common to the operation of the System 200 operating in either the PLL mode or the DLL mode. Additionally, the output from the phase circuit 250 can be generally characterized a differential signal representing the phase difference between the two signals FB and XCLK.

Moreover, the loop control circuit 250, and thereby the System 200, utilize the same common ports and mutual components for operating in either the PLL or DLL mode. Therefore, the XCLK and FB input ports or connections are the same ports/connections which are utilized when the System 200 is operating in either the PLL or DLL mode. Similarly, the output port (OUT) is utilized for obtaining the system output when System 200 is operating in either the PLL or DLL mode.

As previously indicated, the System 200 is capable of being operated in a PLL mode or in a DLL mode. Accordingly, the loop control circuit 250 is coupled to the configurable mode device (CMD) 225, additionally the STM 230 is operatively coupled to the CMD 225. It is understood that the STM 230 and CMD 225 are illustrated separately, but that the STM 230 and CMD 225 could be combined or consolidated in order to form a single device having the same functionality.

Accordingly, the CMD 225 is configured to operate in either the PLL mode or the DLL mode based upon a control signal generated by the state machine (STM) 230. When the CMD 225 is operated in the PLL mode, the STM 230 asserts a multiplexer (Mux) control signal in the CMD 225. Conversely, if the CMD 225 is operated in the DLL mode, the STM 230 de-asserts the multiplexer (Mux) control signal in the CMD 225. When the CMD 225 is operating in the DLL mode, the CMD 225 is configured to operate as a voltage controlled delay line, such as a nine stage voltage controlled delay line (x0 to x8), which is capable of producing a differential output.

The operating signals within the CMD 225 do not operate at full swing, but operate at a swing between a Vcc or supply voltage value (not shown) and VCNTL, where VCNTL can vary based upon the frequency being processed within the System 200. Accordingly, in one embodiment, the CMD 225 incorporates the use of an full swing restorer, such as an analog to digital CMOS full swing restorer, which converts the output signals of the CMD 225 into full logic signals for use in the STM 230.

The state machine (STM) 230, which may be a two-state machine, generates a control signal in response to a mode selection signal based on a mode select input 255, which indicates in which mode, either the PLL or DLL mode, that the CMD 225 is to operate. For instance, the CMD 225 operates as a voltage controlled oscillator (VCO) if the PLL mode is selected. Conversely, if the DLL mode is selected, the CMD 225 operates as a voltage controlled delay line (VCDL). The CMD 225 is coupled to the phase detector 205 by a feedback loop. The CMD 225 generates an output (OUT), the output (OUT) from the CMD 225 is then divided, via the divider device 260, and becomes a feedback or target signal (FB) which is applied to the phase detector 205 via the feedback loop, repeating the synchronization process until the FB signal becomes synchronized with the XCLK signal indicating a locked condition or status. Therefore, upon the selection of the operating mode (mode selection signal) via the mode select input 255, the System 200 operates as either a DLL or a PLL until the respective synchronized state (lock) is achieved.

In the PLL operating mode, the loop control circuit 250 generates the bias signals (n-bias and p-bias) which correspond to the phase difference between the XCLK and FB signals. Accordingly, the state machine (STM) 230 generates a control signal in response to a PLL mode selection signal, via the mode select input 255, which indicates that the CMD 225 is to operate PLL mode. Therefore, the CMD 225 is configured to operate as a voltage controlled oscillator (VCO). The CMD 225, operating as a VCO receives the bias signals from the loop control circuit 250, and generates an output signal (OUT). The output signal (OUT) from the CMD 225 is then divided by the divider device 260 to generate a feedback or target signal (FB) based upon the bias signals supplied to the CMD 225. The FB signal is then applied via the feedback loop to the phase detector 205 to repeat the synchronizing process through the System 200, until the FB signal becomes coincident or in-phase with the XCLK signal thereby achieving a locked state. Therefore, in the PLL mode, the System 200 essentially operates by adjusting the frequency of the output signal based on the biasing signal value as determined by the phase relationship of the XCLK and FB signals.

In the DLL operating mode, the loop control circuit 250 generates the bias signals (n-bias and p-bias) which correspond to the phase difference between the XCLK and FB signals. Accordingly, the state machine (STM) 230 generates a control signal in response to the DLL mode selection signal, via the mode select input 255, which indicates that the CMD 225 is to operate in the DLL mode: Therefore, the CMD 225 operates as a voltage controlled delay line (VCDL).

The CMD 225, operating as a VCDL, is capable of receiving two inputs, a first input in the form of bias signals which are received from the biasing device 220 and a second input from the STM 230 every nth-cycle. The second input from the STM 230 comprises the XCLK signal, which is inputted into the CMD 225 once every nth-cycle, thereby opening the operating loop. The n-cycle value corresponds to the desired feedback or target frequency (FB) to be synthesized by the DLL. For example, if the desired frequency to be synthesized is 400 Hz, and the XLCK signal is 100 Hz, then the n-cycle value would equal 4 {(n-value)× (XCLK)=FB (Synthesized Frequency)}. Therefore, the STM 230, once every nth-cycle, inputs the XCLK signal to the CMD 225 which is operating as a VCDL. The next immediate cycle the CMD 225, operating as a VCDL, generates the feedback or target signal (FB) which is equal to the (n-value) multiplied by the XCLK signal. Therefore, every nth-cycle the loop opens and the XCLK signal is input into the CMD 225, wherein the next immediate cycle the loop closes and loops through 'n−1' cycles, at the 'nth' cycle the loop opens and the process is repeated until the targeted synthesized frequency (FB) is attained (lock). Since the output is adjusted based upon the input every n-cycle, the jitter associated with the system is minimized.

Figure 3:
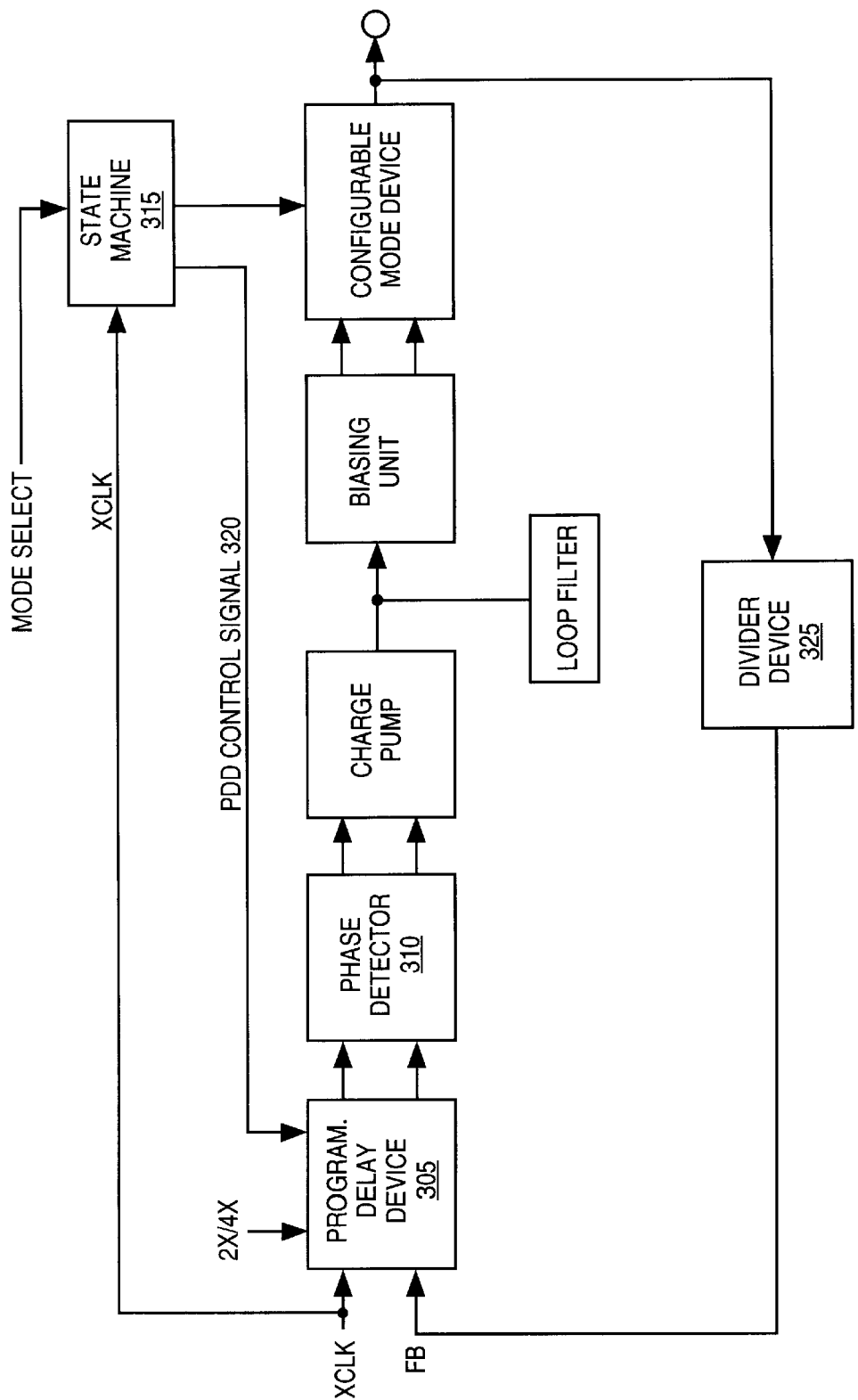
FIG. 3 illustrates an alternate embodiment of the present invention in a block diagram format.

In an alternate embodiment of the synchronization/frequency synthesis system 200 (hereinafter, System 300), illustrated in FIG. 3, the System 300 further comprises a programmable delay device (PDD) 305 coupled to the phase detector 310. The System 300, of FIG. 3, operates in the same manner as disclosed with reference to FIG. 2, with the exception that the feedback or target signal (FB) can be manipulated using the programmable delay device (PDD) 305. The PDD 305 is controlled by the state machine (STM) 315 by a PDD control signal transmitted through a PPD control line 320. The PDD control signal from the PDD control line 320 instructs the PDD 305 as to the type of function to be applied to the feedback or target signal (FB). The PPD 305 is configured to adjust the phase error between the FB signal and XCLK signal in either direction, as both the FB signal and XCLK signal are supplied to the PDD 305 before they are supplied to the phase detector 310.

The PDD 305 is capable of manipulating the feedback or target signal (FB) to conform to the needs of the System 300 in a variety of ways. Specifically, the PDD 305 is capable of adjusting the delay associated with the feedback or target signal (FB) based upon multiple frequency operating modes such as Double Mode 2X and Quad Mode 4X to effectively maintain the synchronization of the target signal (FB) with the XCLK signal. For instance, if the system is operated in the 4X mode and is then subsequently switched to the 2X mode, a finite amount of time is necessarily required to make the switch between the 4X mode and 2X mode in order to compensate for any time delay attributable to the divider device 325. Accordingly, after the mode switching is accomplished, the PDD 305 delays the target signal (FB) to compensate for the time needed to change from 4X mode to 2X mode without affecting the current synchronization of the target signal (FB) and the XCLK signal.

In a typical PLL or DLL, once the clock signal is generated and reaches lock, the actual generated clock signal may be minimally out of phase (semi-locked) by a relatively small period, such as a 100 picoseconds, in either direction. Therefore, the PDD 305 also has the capability of adjusting minor phase error on a locked target signal (FB), so as to minimize any minor phase error encountered in the locked feedback signal (FB).

In another embodiment of the synchronization/frequency synthesis system 200 (hereinafter, System 400), illustrated in FIG. 4, the System 400 further comprises a sampling control device (SCD) 410 coupled between the charge pump 415 and the phase detector 405. The SCD 410 is configured to operate both as a phase detector and as a frequency detector, which allows the SCD 410 to speed up the locking time of the System 400. The sampling control device (SCD) 410 is configured to override the phase detector 420 during periods in which the phase difference between the detected signals (XCLK signal and FB signal) exceeds a threshold phase value. If the FB signal frequency is equal to the XCLK signal frequency, or if the FB signal frequency is within an acceptable operating frequency range with regard to the XCLK signal frequency, then the phase detector processes the signals in accordance phase detector operating parameters.

Figure 4:
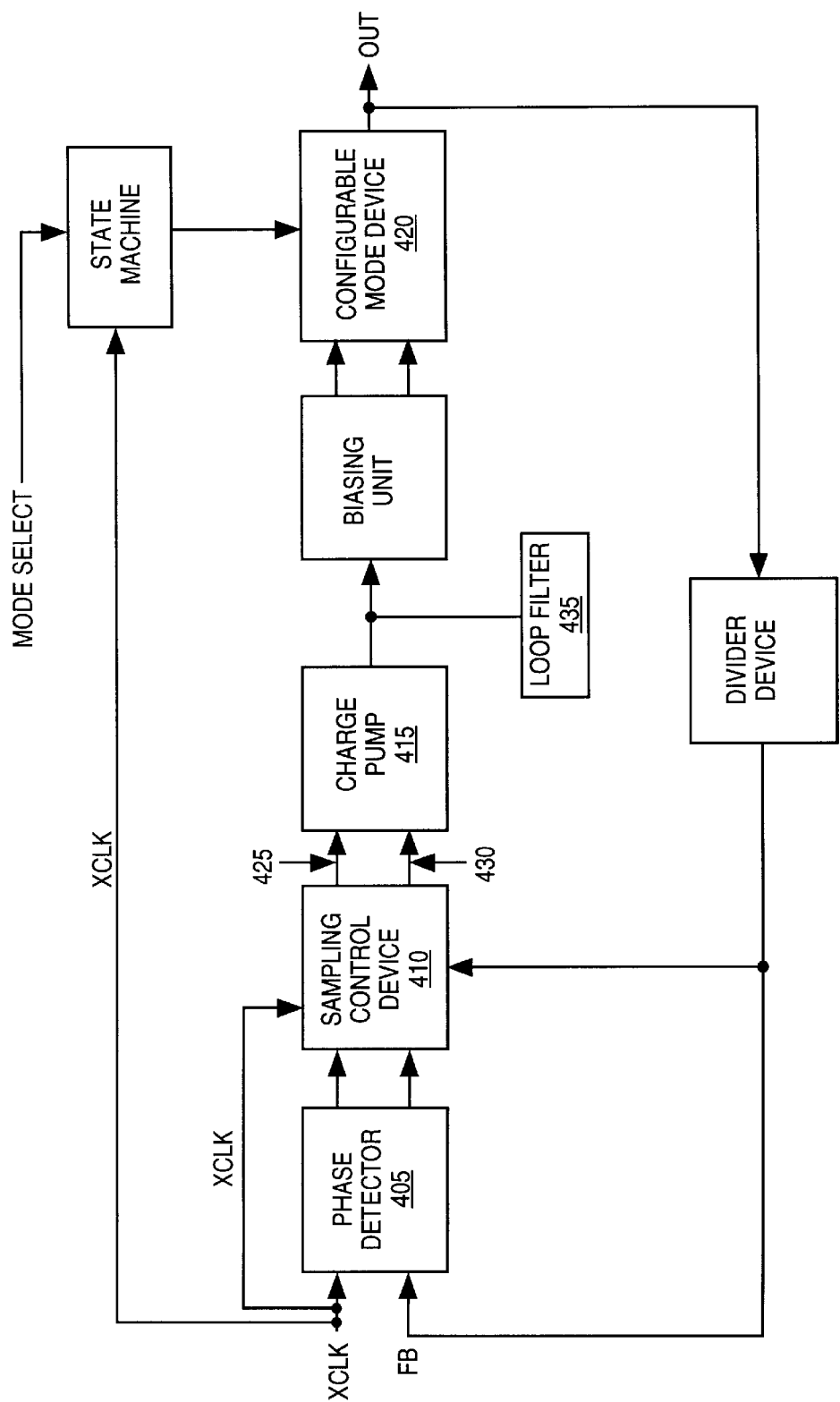
FIG. 4 illustrates another embodiment of the present invention in a block diagram format.

The System 400, of FIG. 4, operates in the same manner as the system described in FIG. 2, with the exception that phase detector output is capable of being overridden by the sampling control device (SCD) 410. It is understood that the width of pulses supplied to the charge pump 415 is directly related to how much charge is deposited to or removed from the loop filter 435, wherein the loop filter 435 determines the frequency generated. The SCD 410 receives both the feedback signal (FB), which is the output of the CMD 420, and the XCLK signal, the SCD 410 then compares the frequency difference between the feedback signal (FB) and the XCLK signal and generates one of three outputs for use in the System 400.

Accordingly, if the feedback signal (FB) frequency is less than the XCLK signal frequency, the SCD 410 generates an UP pulse output having a width proportionate to the difference in frequency (i.e.: phase difference) between FB and XCLK. The UP pulse is supplied to the charge pump 415 through an UP pulse line 425 coupled between the SCD 410 and the charge pump 415. If the FB signal frequency is greater than the XCLK signal frequency, the SCD 410 generates an DN pulse with a width proportionate to the difference in frequency (i.e.: phase difference) between FB and XCLK. The DN pulse is supplied to the charge pump 415 through an DN pulse line 430 coupled between the SCD 410 and the charge pump 415.

The SCD 410 may be implemented utilizing a phase comparator along with an adder/subtractor combination in order to determine and generate the appropriate width of the UP and DN pulse signals. By supplying the respective UP and DN pulse signals, with each pulse signal having a width proportionate to the difference in frequency (i.e.: phase difference), directly to the charge pump 415, the charge pump 415 is able to generate a corresponding charge to the loop filter 435. Accordingly, the VCTNL signal from the loop filter 435 more closely corresponds to the actual phase difference between the FB signal and the XCLK signal, as such, the phase difference between the two signals is decreased at a faster rate than by utilizing only the phase detector 405.

If the FB signal frequency is equal to the XCLK signal frequency, or if the FB signal frequency is within an acceptable operating frequency range with regard to the XCLK signal frequency, then the SCD 410 relinquishes the frequency control to the phase detector 405 to process the FB signal in accordance with phase detector operating parameters.

Figure 5:
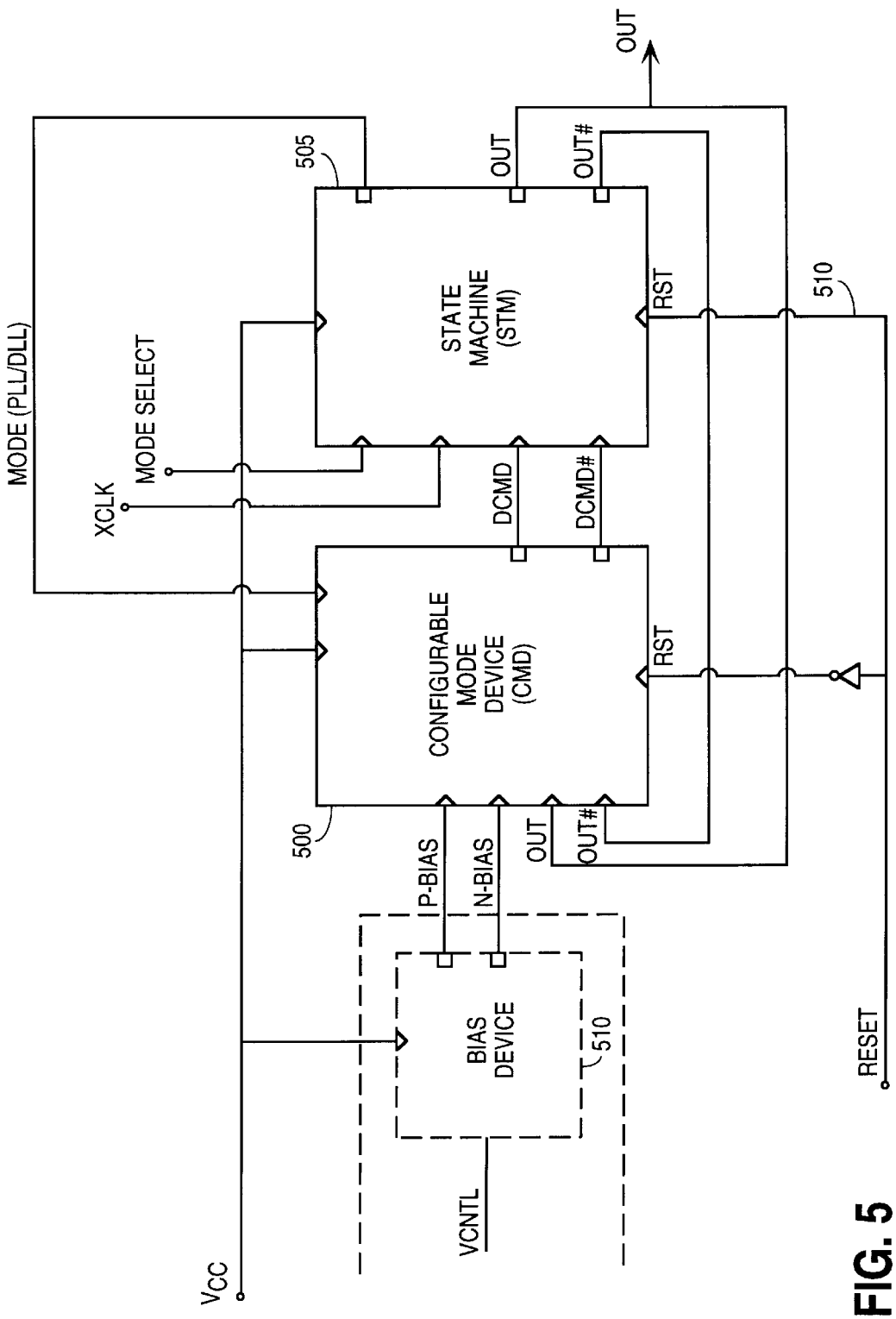
FIG. 5 illustrates an embodiment of the present invention in a logic schematic diagram.

FIG. 5 illustrates the configurable mode device (CMD) 500 synchronizing system and the state machine (STM) 505, in further detail, as respective logic components. Although the actual synchronizing system logic utilizes a phase detector, charge pump, loop filter and biasing device, in addition to the aforementioned components, they are partially omitted from FIG. 5 for clarity. The synchronizing system logic of FIG. 5 is interconnected with various input/output ports associated with each logic component. However, the synchronizing system logic, utilizes the same common ports and select components for operating in either the PLL or DLL mode, as previously mentioned above. Therefore, the XCLK and FB input ports or connections are the same ports/connections that are utilized when the synchronizing system logic is operating in either the PLL or DLL mode. Similarly, the output port (OUT) is utilized for obtaining the system output when the synchronizing system logic is operating in either the PLL or DLL mode.

In FIG. 5, a biasing unit 510 is illustrated as having two inputs, a supply voltage (Vcc) and a control voltage (VCNTL), and two outputs, an n-bias and a p-bias. The CMD 500 is illustrated as having seven inputs, an n-bias and a p-bias which are received from the biasing unit 510, out and out# which are received from the STM 505, a supply voltage (Vcc), a mode selection (MODE SELECT), and a reset. Additionally, the CMD 500 is illustrated as having two outputs, dcmd and dcmd#. The STM 505 is illustrated as having six inputs, supply voltage (Vcc), dcmd and dcmd# received from the CMD 500, an external clock signal (XCLK), and a reset. Additionally, the STM 505 is illustrated as having two outputs, out and out#, which are looped back to the CMD 500 and comprise the two CMD inputs of out and out#.

Figure 6A:
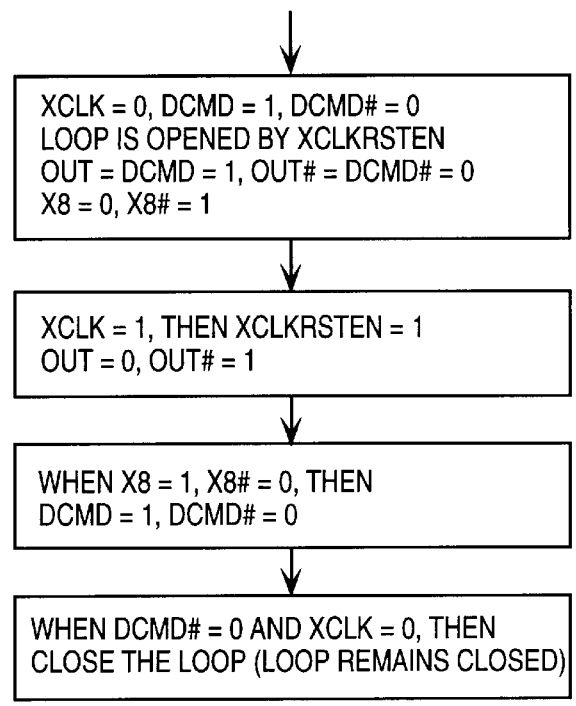
FIG. 6A is a flow diagram illustrating an embodiment of the present invention, as depicted in FIG. 4, operating in a PLL mode.
Figure 6B:
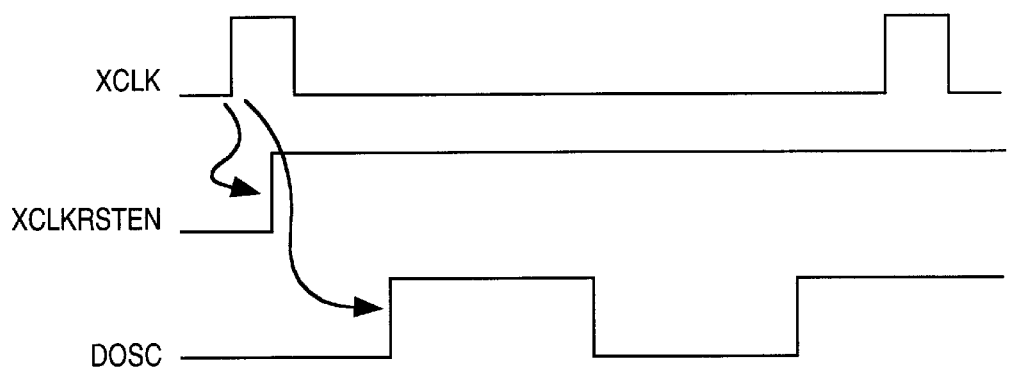
FIG. 6B is a timing diagram illustrating various signals provided to and generated by the embodiment of FIG. 4, while operating in the PLL mode.
Figure 7A:
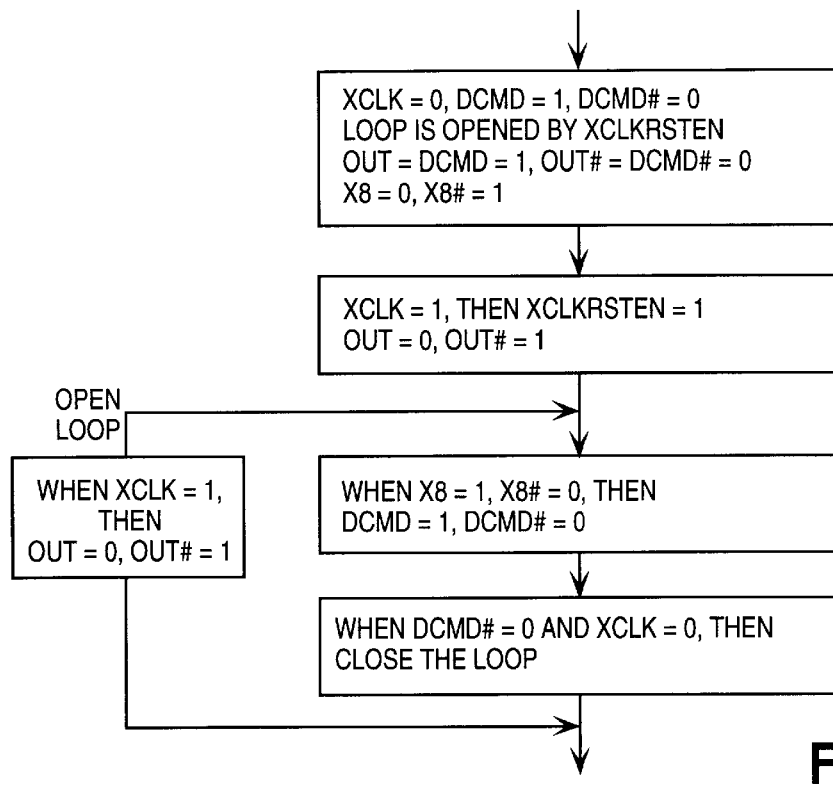
FIG. 7A is a flow diagram illustrating an embodiment of the present invention, as depicted in FIG. 4, operating in a DLL mode.
Figure 7B:
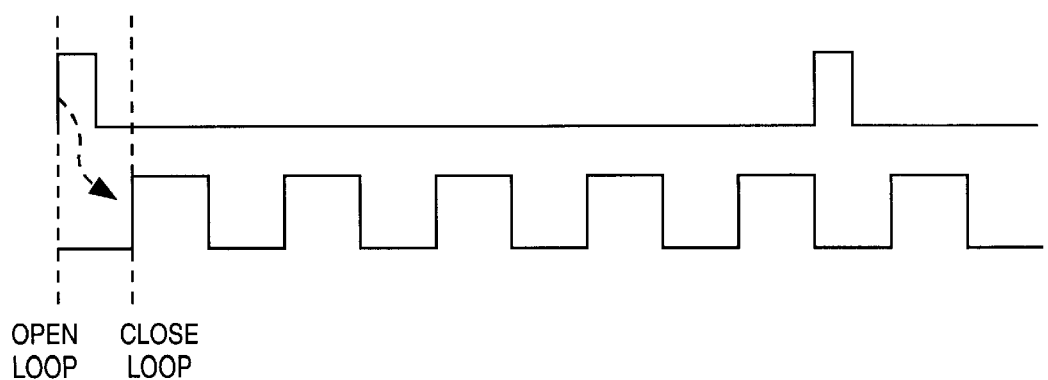
FIG. 7B is a timing diagram illustrating various signals provided to and generated by the embodiment of FIG. 4, while operating in the DLL mode.

The operation of the synchronizing system logic illustrated in FIG. 5, is described with reference to state diagrams as illustrated in FIGS. 6A/B and 7A/B. Accordingly, FIG. 6A illustrates a flow/state diagram, along with FIG. 6B which illustrates a timing diagram corresponding to the operation of the STM 505 and CMD 500, and thereby the synchronizing system logic, while operating in the PLL mode. FIG. 7A illustrates a flow/state diagram, along with FIG. 7B which illustrates a timing diagram corresponding to the operation of the STM 505 and CMD 500, and thereby the synchronizing system logic, while operating in the DLL mode.

In the PLL mode, as illustrated in FIG. 6A, the STM 505 first initializes the synchronizing system logic, of FIG. 5, by setting the XLCK signal to a logic value of zero (0) (XCLK=0). When XCLK is set to zero (0), the value of dcmd is forced to a logic value of one (1) (dcmd=1) and the value of dcmd#, which is the inverse of dcmd, is forced to a logic value of zero (0) (dcmd#=0). The loop is opened by the xclkrsten (external clock reset enable) which can be activated through the reset line 510 of the STM 505. Accordingly, since the value of dcmd is equal to one (dcmd=1), the value of out is set to a logic value of one (out=1). Additionally, since the value of dcmd# is equal to zero (dcmd#=0), the value of out#, which is the inverse of out, is set to a logic value of zero (out=0). If the CMD 500, for example, is comprised of nine stages, the value of x8 (nine stages) is set to a logic value of zero (x8=0) and the value of x8# (nine stages), which is the inverse of x8, is set to a logic value of one (x8#=1). However, the number of stages can be altered to suit any application that is desired of the CMD 500. Next, the value of XCLK is set to one (XCLK=1), wherein the xclkrsten value is enabled or is set to one (xclkrsten=1), forcing the values of out and out# to flip, wherein out=0 and out#=1. Accordingly, when x8=1 and x8#=0, the value of dcmd and dcmd# are flipped, wherein dcmd becomes one (dcmd=1) and the value of dcmd# becomes zero (dcmd#=0). When dcmd# equals zero (dcmd#=0) and the XCLK equals zero (XCLK=0) the loop is closed.

In the DLL mode, as illustrated in FIG. 7A, the STM 505 first initializes the synchronizing system logic, illustrated in FIG. 5, by setting the XLCK signal to a logic value of zero (0) (XCLK=0). When XCLK is set to zero (0), the value of dcmd is forced to a logic value of one (1) (dcmd=1) and the value of dcmd#, which is the inverse of dcmd, is forced a logic value of zero (0) (dcmd#=0). The loop is opened by the xclkrsten (external clock reset enable) which can be activated through the reset line 510 of the STM 505. Accordingly, since the value of dcmd is equal to one (dcmd=1), the value of out is set to a logic value of one (out=1). Additionally, since the value of dcmd# is equal to zero (dcmd#=0), the value of out#, which is the inverse of out, is set to a logic value of zero (out=0). If the CMD 500, for example, is comprised of nine stages, the value of x8 (nine stages) is set to a logic value of zero (x8=0) and the value of x8# (nine stages), which is the inverse of x8, is set to a logic value of one (x8#=1). However, the number of stages can be altered to suit any application that is desired of the CMD 505. Next, the value of XCLK is set to one (XCLK=1), wherein the xclkrsten value is also set to one (xclkrsten=1), forcing the values of out and out# to flip, wherein out=0 and out#=1. Accordingly, when x8=1 and x8#=0, the value of dcmd and dcmd# are flipped, wherein dcmd becomes one (dcmd=1) and the value of dcmd# becomes zero (dcmd#=0). When dcmd# equals zero (dcmd#=0) and the XCLK equals zero (XCLK=0), then the loop is closed. However, the loop is opened every n-cycle, wherein the XCLK signal is set to a logic value of one (XCLK=1) resulting in the setting of the value of out to zero (out=0) and the value of out# to one (out#=1). The opening of the loop is carried out every n-cycle until the desired output is achieved.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. A circuit comprising:
   a configurable mode device configured to generate an output signal using a differential signal, the differential signal representing a phase difference between at least two signals; and
   a state machine configured to generate a control signal in response to a mode selection signal, wherein the control signal configures the configurable mode device to operate in either a delay lock loop mode or a phase lock loop mode.

2. The circuit of claim 1, wherein the circuit is configured to operate in either the delay lock loop mode or the phase lock loop mode with common input and output ports.

3. The circuit of claim 1, wherein the configurable mode device is configured to operate as a voltage controlled oscillator when the configurable mode device is operating in the phase lock loop mode.

4. The circuit of claim 1, wherein the configurable mode device is configured to operate as a delay line device when the configurable mode device is operating in the delay lock loop mode.

5. The circuit of claim 1, further including a divider device coupled to the configurable mode device, wherein the divider device is configured to adjust the frequency of an output signal from the configurable mode device.

6. The circuit of claim 5, wherein the adjusted output signal from the configurable mode device is supplied to a phase circuit as a feedback signal.

7. The circuit of claim 1, further including a programmable delay device, wherein the programmable delay device is configured to adjust a delay associated with a change in operating mode of a multiple frequency feedback signal provided to a phase circuit.

8. The circuit of claim 7, wherein the programmable delay device is configured to adjust a phase error associated with a semi-locked feedback signal provided to the phase circuit.

9. The circuit of claim 1, wherein the configurable mode device further includes a full CMOS logic restorer.

10. A circuit comprising:
a phase circuit configured to generate a differential signal based on a phase difference between at least two input signals;
a configurable mode device configured to generate an output signal based on the differential signal, wherein the configurable mode device is capable of being operated in either a delay lock loop mode or a phase lock loop mode; and
a control device coupled to the configurable mode device, wherein the control device is configured to generate a control signal in response to a mode selection signal, the control signal configuring the circuit to operate as a phase lock loop or delay lock loop.

11. The circuit of claim 10, wherein the circuit is configured to operate in either the delay lock loop mode or the phase lock loop mode with common input and output ports.

12. The circuit of claim 10, wherein the configurable mode device is configured to operate as a voltage controlled oscillator when the configurable mode device is operating in the phase lock loop mode.

13. The circuit of claim 10, wherein the configurable mode device is configured to operate as a delay line device when the configurable mode device is operating in the delay lock loop mode.

14. The circuit of claim 10, further including a divider device coupled to the configurable mode device, wherein the divider device is configured to adjust the frequency of an output signal from the configurable mode device.

15. The circuit of claim 14, wherein the adjusted output signal from the divider device is provided to the phase circuit as a feedback signal.

16. The circuit of claim 10, further including a programmable delay device, wherein the programmable delay device is configured to adjust a delay factor associated with the frequency of a multiple frequency feedback signal provided to the phase circuit.

17. The circuit of claim 10, wherein the programmable delay device configured to adjust a phase error associated with a semi-locked feedback signal provided to the phase circuit.

18. The circuit of claim 7, wherein the phase circuit includes a phase detector.

19. The circuit of claim 18, wherein a sampling control device is coupled to the phase detector and is configured to override an output of the phase detector.

20. The circuit of claim 19, wherein the sampling control device is configured to generate a signal pulse having a width proportionate to a phase difference value between the output signal of the configurable mode circuit and a system reference signal.

21. The circuit of claim 20, wherein the signal pulse from the sampling control device is used in modifying the output signal of the configurable mode circuit by an amount equivalent to the signal pulse width.

22. The circuit of claim 10, wherein the configurable mode device further includes a full CMOS logic restorer.

23. A method of synchronizing at least two signals, the method comprising:
generating a differential signal representing a phase difference between the at least two signals;
applying the differential signal to a configurable mode circuit to generate an output signal, wherein the configurable mode circuit is configured to operate in either a delay lock loop mode or a phase lock loop mode; and
supplying a control signal to the configurable mode circuit, the control signal controlling the operating mode of the configurable mode circuit based upon a selected mode of operation, wherein the configurable mode circuit processes the output signal in either a phase lock loop or a delay lock loop.

24. The method of claim 23, wherein the method utilizes common input and output ports when operating in either a delay lock loop mode or a phase lock loop mode.

25. The method of claim 23, further including the step of configuring the configurable mode device to operate as a voltage controlled oscillator or a delay line based upon the control signal indicating the selected mode of operation.

26. The method of claim 23, further including the step of adjusting the frequency of an output signal from the configurable mode device.

27. The method of claim 23, further including the step of adjusting a delay factor associated with the frequency of a multiple frequency feedback signal provided to a phase circuit.

28. The method of claim 27, further including the step of adjusting a phase error associated with a semi-locked feedback signal provided to the phase circuit.

29. The method of claim 23, further including the step of generating a signal pulse based upon a phase difference value between an output signal from the configurable mode circuit and a reference signal.

30. The method of claim 29, wherein the signal pulse width is proportionate to the phase difference between the output signal of the configurable mode circuit and the reference signal.

31. The method of claim 30, further including the step of modifying the output signal of the configurable mode circuit by an amount proportionate to the signal pulse width.

* * * * *

UNITED STATES PATENT AND TRADEMARK OFFICE
CERTIFICATE OF CORRECTION

PATENT NO. : 6,043,717 Page 1 of 1
DATED : March 28, 2000
INVENTOR(S) : Kurd

It is certified that error appears in the above-identified patent and that said Letters Patent is hereby corrected as shown below:

Column 7,
Line 7, after "mode", delete ":", insert -- . --.

Column 9,
Line 64, delete "out=0", insert -- out#=0 --.

Column 10,
Line 25, delete "out=0", insert -- out#=0 --.

Signed and Sealed this

Twenty-first Day of January, 2003

JAMES E. ROGAN
*Director of the United States Patent and Trademark Office*